US008691598B1

(12) United States Patent
McWhirter et al.

(10) Patent No.: US 8,691,598 B1
(45) Date of Patent: Apr. 8, 2014

(54) DUAL-LOOP CONTROL FOR LASER ANNEALING OF SEMICONDUCTOR WAFERS

(71) Applicant: Ultratech, Inc., San Jose, CA (US)

(72) Inventors: James T. McWhirter, San Jose, CA (US); David Gaines, Livermore, CA (US); Joseph Lee, Castro Valley, CA (US); Paolo Zambon, Campbell, CA (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 13/706,397

(22) Filed: Dec. 6, 2012

(51) Int. Cl.
*H01L 21/00* (2006.01)
(52) U.S. Cl.
USPC ............................ 438/10; 372/33; 372/38.1
(58) Field of Classification Search
USPC ............... 438/10, 14, 15, 17, 18, 50, 54, 530, 438/584, 763; 372/29, 31, 33, 38, 43, 50; 374/5, 129, 137, 30, 124
See application file for complete search history.

(56) References Cited

U.S. PATENT DOCUMENTS

| 4,677,632 | A | | 6/1987 | Lisco et al. |
|---|---|---|---|---|
| 5,157,543 | A | * | 10/1992 | Fukuzawa et al. ............ 359/298 |
| 5,517,420 | A | | 5/1996 | Kinsman et al. |
| 6,151,344 | A | * | 11/2000 | Kiely et al. ................. 372/38.02 |
| 6,606,447 | B2 | | 8/2003 | Brown et al. |
| 8,576,888 | B2 | | 11/2013 | Nguyen et al. |
| 2002/0027690 | A1 | | 3/2002 | Bartur et al. |
| 2005/0180711 | A1 | | 8/2005 | Kamath et al. |
| 2007/0212859 | A1 | * | 9/2007 | Carey et al. .................. 438/487 |
| 2009/0206065 | A1 | | 8/2009 | Kruth et al. |
| 2010/0084744 | A1 | * | 4/2010 | Zafiropoulo et al. ......... 257/618 |

OTHER PUBLICATIONS

Kitching et al., Measurements of 1/f Frequency Noise Reduction in Semiconductor Lasers Using Optical Feedback with Dispersive Loss, Oct. 1993, Journal of Lightwave Technology, vol. 11, No. 10, pp. 1526-1532.*
Shen et al., Laser heated diamond cell system at the Advanced Photon Source for in situ x-ray measurements at high pressure and temperature, Feb. 2001, Review of Scientific Instruments, vol. 72, No. 2, pp. 1273-1282.*
Deinzer et al., Laser power stabilizing control system for high power CO2 laser welding, 1994, SPIE vol. 2062, pp. 84-92.*
Wen-bin et al., Real-time power measurement and control for high power diode laser, 2011, Proc. of SPIE, vol. 8192, pp. 819247-1 to 819247-5.*
Instrument for Measuring Temperature of Water, NASA Tech Briefs, Feb. 2003, p. 16.*
Gutirrez et al., Design How-To Proportional-Integral-Derivative explained, EE Times, Apr. 2007, pp. 1-5.*

* cited by examiner

*Primary Examiner* — Charles Garber
*Assistant Examiner* — Syed Gheyas
(74) *Attorney, Agent, or Firm* — Opticus IP Law PLLC

(57) ABSTRACT

Systems and methods for performing semiconductor laser annealing using dual loop control are disclosed. The first control loop operates at a first frequency and controls the output of the laser and controls the 1/f laser noise. The second control loop also controls the amount of output power in the laser and operates at second frequency lower than the first frequency. The second control loop measures the thermal emission of the wafer over an area the size of one or more die so that within-die emissivity variations are average out when determining the measured annealing temperature. The measured annealing temperature and an annealing temperature set point are used to generate the control signal for the second control loop.

9 Claims, 2 Drawing Sheets

DUAL-LOOP CONTROL FOR LASER ANNEALING OF SEMICONDUCTOR WAFERS

FIELD

The present disclosure relates generally to laser annealing of semiconductors, and in particular relates to dual-loop control for semiconductor laser annealing.

BACKGROUND ART

Laser annealing (also called laser spike annealing or laser thermal processing) is used in semiconductor manufacturing for a variety of applications, including for activating dopants in select regions of devices (structures) formed in a semiconductor wafer when forming active microcircuits such as transistors.

One form of laser annealing uses a scanned laser beam ("laser annealing beam") to heat the surface of the wafer to a temperature (the "annealing temperature") for a time long enough to activate the dopants in the semiconductor structures (e.g., source and drain regions) but short enough to prevent substantial dopant diffusion. The time that the wafer surface is at the annealing temperature is determined by the power density of the laser annealing beam, as well as the exposure time, which is given by the width of the beam along the scan direction divided by the velocity at which the laser annealing beam is scanned (the "scan velocity").

Typical semiconductor processing requirements call for the annealing temperature to be between 400° C. and 1,300° C., with a temperature uniformity of +/−3° C. To achieve this degree of temperature uniformity, the laser annealing beam needs to have a relatively uniform intensity in the cross-scan direction, which under most conditions represents less than a +/−5% intensity variation.

However, even when the laser annealing beam is made spatially very uniform, feedback to the laser is required to ensure that the annealing temperature remains uniform to within the stated tolerance. Local emissivity variations on patterned wafers can cause a temperature measurement error when the system cannot distinguish between a change in emission due to true temperature change and a local change in emissivity. For most logic device wafers, the thickness and composition of the patterned regions is such that the deviation in pattern emissivity from bulk silicon is relatively small.

For other types of device wafers, the variations in emissivity can be substantial. For example, memory wafers have thick metal lines. Also, certain logic wafers include a silicide step wherein the patterned regions have a relatively thick metal-silicide (e.g., NiSi). In both of these cases, the variation in thermal emission from the emissivity variations is large. Consequently, as the laser annealing beam scans such wafers, the amplitude and time-frequency of the pattern-induced emission variation is such that the temperature control system can become unstable.

Re-tuning the temperature control system to respond to emission spikes would cause the laser power to be modulated in response to emissivity variations, and not temperature variations. As a result, the laser annealing system must process silicide and memory wafers in open loop (constant laser power) condition, which limits the temperature uniformity performance of the laser anneal due to the uncompensated effects such as laser power density fluctuation and/or variation in the local substrate temperature.

This in turn limits the maximum safe annealing temperature. The annealing temperature needs to be kept below the damage threshold temperature of the wafer. The wider distribution of anneal temperatures under open-loop processing requires a reduction in the mean anneal temperature to keep the extremes of the anneal temperature distribution below the damage threshold. This presents a process compromise when (as is the case in most spike anneal process applications) a higher anneal temperature (below damage threshold) produces a superior process result

SUMMARY

An aspect of the disclosure is a method of laser annealing a wafer having a surface that supports an array of dies. The method includes scanning an annealing laser beam from the laser over the array of dies, wherein the laser has laser noise and is adjustable to control an amount of power in the annealing laser beam. The method also includes measuring and controlling the amount of power in the annealing laser beam using a first control loop that measures the amount of power and operates at a first frequency $f_1$ to control the laser noise in the laser. The method further includes controlling the amount of power in the annealing laser beam using a second control loop that operates at a second frequency $f_2 < f_1$ by measuring thermal emission radiation from the wafer, including averaging the thermal emission radiation over at least one die and determining therefrom a corresponding average measured temperature, and using the average measured temperature and an annealing temperature set point to adjust the laser to control the amount of power in the annealing laser beam.

Another aspect of the disclosure is a laser annealing system for annealing dies supported by a wafer having a surface that supports dies each having a variation in emissivity. The system includes a chuck that supports the wafer, and a movable stage that supports the chuck and that is adapted to move the chuck and wafer. The system also has a laser that generates an initial laser beam and that has an adjustable output power and 1/f noise. The system further includes an optical system configured to receive the initial laser beam and form therefrom an annealing laser beam and to direct a portion of the annealing laser beam to a photodetector system that in response generates a detector signal. The optical system is arranged so that the annealing laser beam is made incident upon and scans over the wafer surface due to the movement of the wafer, and heats the wafer to an annealing temperature. The system also includes a thermal emission detector system arranged relative to the wafer surface and configured to receive thermal emission radiation therefrom that is generated by the annealing laser beam and average the received thermal emission radiation over an area of one or more of the dies, and in response generates a thermal emission signal. The system also has a first control loop configured to receive the detector signal and control the laser to adjust the output power at a first frequency $f_1$ in the range from 1 kHz to 100 kHz to reduce the 1/f noise. The system further has a second control loop configured to receive the thermal emission signal and control the laser to adjust the output power at a second frequency $f_2$ in the range from 1 Hz to 100 Hz to reduce variations in the annealing temperature.

Another aspect of the disclosure is a dual-loop control system for a laser annealing system that uses an annealing laser beam from a laser having 1/f noise and a controllable output power to anneal a wafer having dies that each have a variation in emissivity. The system has first and second control loops. The first control loop operates at first frequency $f_1$ in a range between 1 kHz and 100 kHz and is configured to control the laser output power to reduce the 1/f laser noise. The second control loop operates at a second frequency $f_2$ in a range between 1 Hz and 100 Hz and measures thermal emission radiation from the wafer over an area of one die or greater. The thermal emission is caused by the annealing laser beam heating the wafer to an annealing temperature. The second control loop is configured to determine a measured wafer temperature from the measured thermal emission radiation and generate a measured temperature signal. The measured temperature signal is then used in combination with an annealing temperature set point signal to control the laser output to minimize variations in the annealing temperature.

Additional features and advantages of the disclosure are set forth in the detailed description that follows, and in part will be readily apparent to those skilled in the art from that description or recognized by practicing the disclosure as described herein, including the detailed description which follows, the claims, as well as the appended drawings.

It is to be understood that both the foregoing general description and the following Detailed Description present embodiments of the disclosure, and are intended to provide an overview or framework for understanding the nature and character of the disclosure as it is claimed.

The claims are incorporated into and constitute part of the Detailed Description.

BRIEF DESCRIPTION OF THE DRAWINGS

The accompanying drawings are included to provide a further understanding of the disclosure, and are incorporated into and constitute a part of this specification. The drawings illustrate various embodiments of the disclosure, and together with the description serve to explain the principles and operations of the disclosure. In certain of the drawings, Cartesian coordinates are provided for reference and are not intended to be limiting as to direction and orientation.

DETAILED DESCRIPTION

Reference is now made in detail to embodiments of the disclosure, examples of which are illustrated in the accompanying drawings. Whenever possible, the same or like reference numbers and symbols are used throughout the drawings to refer to the same or like parts.

Figure 1:
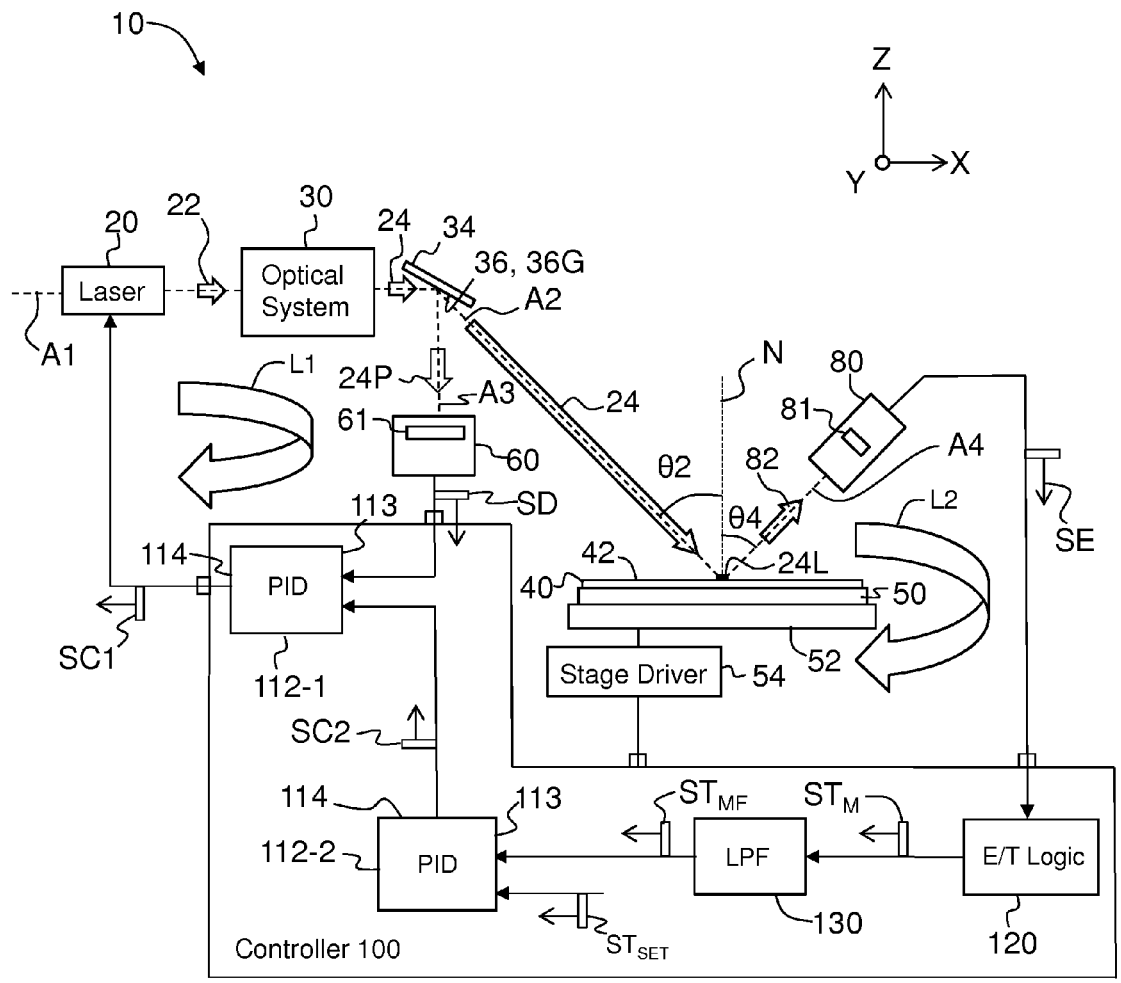
FIG. 1 is a schematic diagram of an example laser annealing system that illustrates an embodiment of the dual-loop control system for the laser annealing system when performing laser annealing of a semiconductor wafer.

FIG. 1 is a schematic diagram of an example laser annealing system 10 that illustrates an embodiment of the dual-loop control configuration for the system. A Cartesian coordinate system is shown for the sake of reference. Example laser annealing systems 10 are described, for example, U.S. Pat. Nos. 7,612,372, 7,154,066 and 6,747,245, and U.S. Patent Application Publications No. 2010/0084744 and 2012/0100640, all of which are incorporated by reference herein.

System 10 includes laser 20 that emits an initial laser beam 22 along an optical axis A1 that runs in the X-direction. An example laser 20 is a $CO_2$ laser that emits light at a nominal annealing wavelength $\lambda_A$ of 10.6 μm. Laser 20 may also consist of or include one or more diode lasers.

System 10 also includes an optical system 30 arranged along optical axis A1 downstream of laser 20. Optical system 30 is configured to receive initial laser beam 22 and form therefrom a laser annealing beam (also referred to below as annealing laser beam) 24. Example optical system 30 can include lenses, mirrors, apertures, filters, active optical elements (e.g., variable attenuators, etc.) and combinations thereof. Examples of optical systems 30 are disclosed in U.S. Pat. Nos. 8,026,519, 8,014,427, 7,514,305, 7,494,942, 7,399,945 and 6,366,308, all of which are incorporated by reference herein, and are also disclosed in the aforementioned U.S. Patent Publication No. 2012/0100640.

In an alternate embodiment of system 10, a second laser and a second laser beam (not shown) are used to enhance the annealing process, e.g., by pre-heating the wafer.

Also arranged along optical axis A1 downstream of optical system 30 is a beam-turning element 34, such as a mirror having a surface 36 that is substantially reflective at the annealing wavelength $\lambda_A$. This may be accomplished, for example, by making beam-turning element 34 out of copper and providing surface 36 as a gold coating. In an example, beam-turning element is part of optical system 30, and is shown as being separate by way of example and for ease of illustration and discussion.

Beam-turning element 34 defines a second optical axis A2 that is directed toward a semiconductor wafer 40 having a top surface ("surface") 42 with a surface normal N. Wafer 40 is supported by a chuck 50 (e.g., a heated chuck), which in turn is supported by a moveable wafer stage 52 that is driven by a stage driver 54. Optical axis A2 defines an incident angle θ2 on wafer surface 42 relative to surface normal N. Laser annealing beam 24 travels down optical axis A2 and intersects wafer surface 42. Wafer 40 has an overall wafer temperature $T_W$, which in an example is determined by heated chuck 50, and which in an example is at least greater than room temperature.

In an example, the intersection of annealing laser beam 24 with wafer surface 42 defines a laser beam line or "line image" 24L that scans over wafer surface 42. The scanning of line image 24L can accomplished by moving stage 52 by the operation of stage driver 54, by adjusting beam-turning element 34 to cause the annealing laser beam to be scanned, or a combination of these two actions.

As discussed above, typical semiconductor processing requirements call for the annealing temperature $T_A$ to be between 400° C. and 1,300° C., with a temperature uniformity of +/−3° C. To achieve this degree of temperature uniformity, annealing laser beam 24 needs to have a relatively uniform intensity in the cross-scan direction, which under most conditions is less than a +/−5% intensity variation.

In an example, the maximum temperature for laser spike annealing is at least about 25° C. below the melt temperature of the material being annealed. In the case of silicon-based devices, the melt temperature of silicon is 1413° C. so that in an example the maximum temperature will be about 1388° C.

In the case of germanium-enriched silicon, the melt temperature of the alloy depends on the percentage of Ge in the alloy. For 30% Ge, the melt temperature is approximately 1225° C., so that an example maximum temperature for laser annealing will be about 25° C. lower, or about 1200° C.

Figure 2:
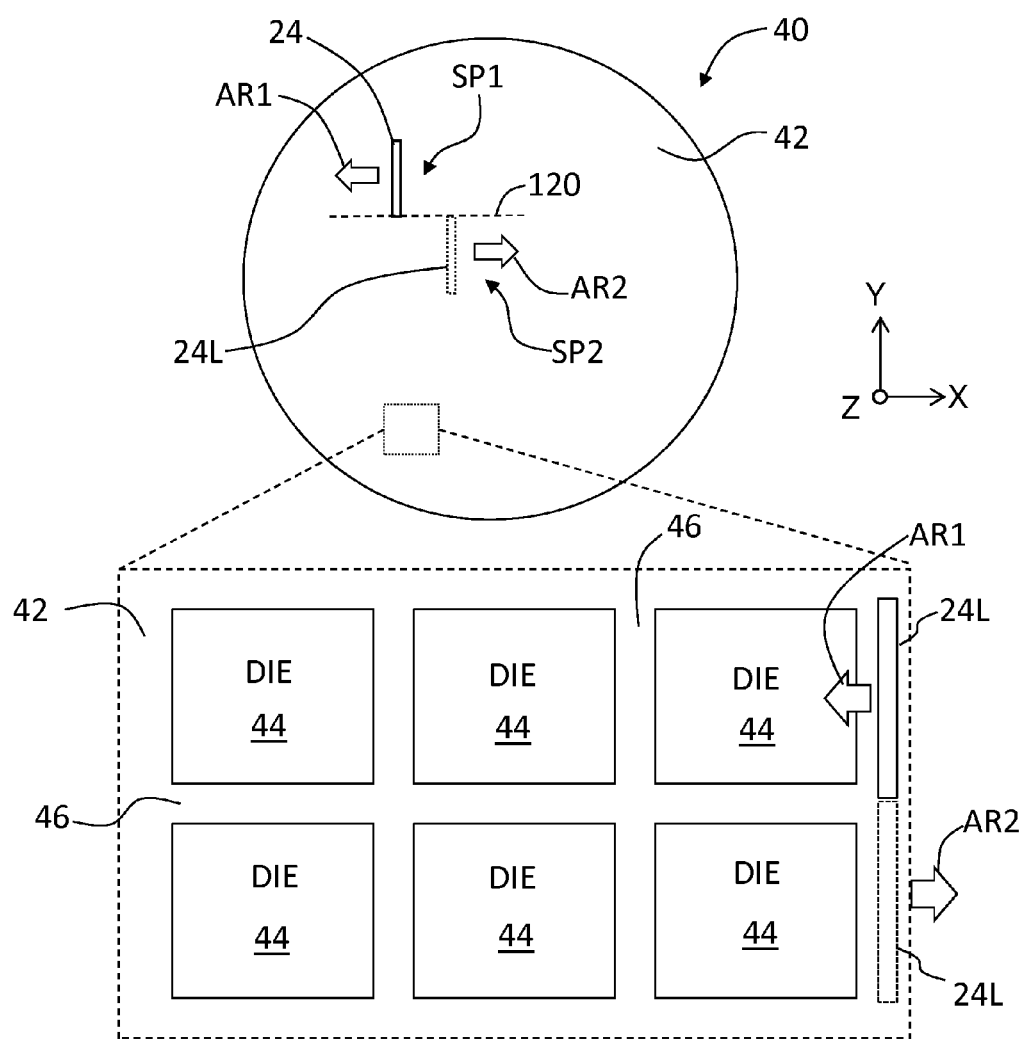
FIG. 2 is a plan view of an example wafer showing the line image formed by the annealing laser beam scanning over the laser surface, and including an inset that shows the wafer having an array of dies formed on the wafer surface.

In the case of GaN on sapphire devices, the melt temperature of GaN is over 2500° C., but the melt temperature of the Sapphire substrate is lower at 2040° C. Thus, the non-melt annealing process is limited by the melt temperature of the sapphire substrate FIG. 2 is a plan view of an example wafer 40 that includes a close-up inset that shows the wafer surface 42 supporting an array of dies 44 each separated by a kerf region 46. Dies 44 represent regions where one or more integrated circuit (IC) chips are formed, with each IC chip comprising semiconductor devices and semiconductor device structures (not shown).

In one example, wafer 40 is a logic wafer used to make logic IC chips, while in another example the wafer is a memory wafer used to make memory IC chips.

As discussed above, the semiconductor devices and semiconductor device structures within dies 44 can have features with different emissivities, which can lead to the miscalculation of annealing temperatures during the annealing process when trying to measure annealing temperatures within a given die. For example, as mentioned above, memory wafers usually have thick metal lines. Also, logic wafers can include a silicide step wherein the patterned regions have a relatively thick metal-silicide (e.g., NiSi) layer. Metal lines and metal-silicide have much lower emissivities than the underlying silicon.

In FIG. 2, the line image 24L is shown as being scanned back and forth over wafer surface 42 to cover adjacent rows of dies 44. The scanning is indicated by arrows AR1 and AR2, which correspond to adjacent scan paths SP1 and SP2 for line image 24L. Scanning of the line image 24L across the wafer surface 42 may be accomplished by using the moveable wafer stage 52 to scan wafer surface under a stationary line image 24L or by scanning the line image 24L across a stationary wafer surface 42 by use of appropriate scanning optical elements as part of optical system 30 or the beam-turning element 34. By extension, a combination of these two approaches may be used.

In an example, surface 36 of beam-turning element 34 is configured to deflect a relatively small portion 24P of laser annealing beam 24 along an optical axis A3. In an example, this is accomplished by providing a weak (e.g., lightly scribed) diffraction grating 36G onto surface 36. A photodetector system 60 is arranged along optical axis A3 and is arranged to receive laser annealing beam portion 24P and in response thereto generate a detector signal SD representative of the measured power. In an example, the amount of power in laser annealing beam portion 24P is only a few percent of the power in laser annealing beam 24. Whether by design or by calibration, the amount of power in annealing laser beam portion 24P is a known fraction of annealing laser beam 24, so that a measurement of the annealing laser beam portion provides a measure of the amount of optical power in the annealing laser beam.

Photodetector system 60 is selected to detect laser annealing beam portion 24P at the laser (annealing) wavelength $\lambda_A$. In the case where laser 20 is a $CO_2$ laser, an example photodetector system includes a cooled HgCdTe detector. In this case, laser annealing beam portion 24P is substantially monochromatic so that photodetector system 60 can include a narrow-band optical filter 61 configured to prevent the detection of light of other wavelengths. Filter 61 may be cooled to reduce background thermal emission.

System 10 also includes a thermal emission detector system 80 that resides along an optical axis A4 that defines an angle θ4 on wafer surface 42 relative to surface normal N. In an example, optical axis A4 intersects optical axis A2 at wafer surface 42. In an example, angle θ4 is equal to the Brewster's angle for the wafer. The Brewster's angle for silicon is about 75°.

Thermal emission detector system 80 is configured to measure thermal emission radiation 82 emitted by wafer surface 42 during the laser annealing process, and generate in response thereto an electrical emission signal SE representative of the measured thermal emission E. An example thermal emission detector system 80, along with method of calculating a measured temperature $T_M$ from the measured thermal emission E, is described in the aforementioned U.S. Patent Application Publication No. 2012/0100640.

System 10 also includes a controller 100 that is operably connected to laser 20, stage driver 54, photodetector system 60 and thermal emission detector system 80. Controller 100 has a number of logic and control components and can be configured using one or more field-programmable gate arrays (FPGAs) and other programmable and non-programmable electronic components known to those skilled in the art, such as processor units, memory units, filters, feedback controllers, etc. Controller 100 is configured (e.g., via instructions embodied in computer-readable media of one or more of the programmable components) to carry out the dual-loop control methods described herein.

Controller 100 includes a first feedback controller 112-1 shown by way of example and referred to hereinafter as a first proportional-integral-derivative (PID) controller. First PID controller 112-1 has an input end ("input") 113 and an output end ("output") 114. Photodetector 60 is electrically connected to input 113, while laser 20 is electrically connected to output 114.

Controller 100 also includes an emission-to-temperature logic unit ("E/T logic") 120 electrically connected to thermal emission detector system 80. E/T logic 120 is configured to receive the measured emission signal SE and convert the measured emission E to a measured temperature $T_M$, and output a corresponding measured temperature signal $ST_M$. The measured temperature signal $ST_M$ represents an averaged measured temperature, as calculated from measured emission signal SE. The average is over a time window determined by the bandwidth of thermal emission detector system 80 and measured emission signal SE.

The measured emission signal SE generally includes spikes due to die emissivity variations. These spikes will show up in the measured temperature signal $ST_M$ if they not suppressed. Consequently, in an example embodiment, E/T logic 120 is electrically connected to a low-pass filter (LPF) 130 that low-pass filters measured temperature signal $ST_M$ to form a low-pass filtered ("filtered") measured temperature signal $ST_{MF}$. In an example, LPF 130 is formed from a signal-processing device such as a field-programmable gate array (FPGA) that performs a running average or a spike suppression algorithm in addition to performing low-pass filtering.

Controller 100 also includes a second feedback controller 112-2 also referred to hereinafter as the second PID controller by way of example. LPF 130 is electrically connected to input 113 of second PID controller 112-2. An annealing temperature set-point that is embodied in an annealing temperature set-point signal $ST_{SET}$ is also inputted to input 113 of second PID controller 112-2. The set-point defines a set-point annealing temperature $T_{AS}$ for the annealing process.

The output of second PID controller 112-2 is electrically connected to input 113 of the first PID controller 112-1. Second PID controller 112-2 outputs a second control signal SC2 that corresponds to a requested amount of laser power to maintain a substantially uniform annealing temperature $T_A$, i.e., as close to the set-point annealing temperature $T_{AS}$ as possible. The second control signal SC2 and the detector signal SD from photodetector 60 are inputted into first PID controller 112-1. PID controller 112-1 processes the second control signal SC2 and detector signal SD and outputs a first control signal SC1 to laser 20 that instructs the laser to deliver a select amount of power, or to adjust its output by a select amount so that annealing laser beam 24 has the select amount of power.

The configuration of system 10 defines two coupled control loops schematically indicated in FIG. 1 as L1 and L2. The first control loop L1 operates at a first frequency $f_1$ and is defined by laser 20, photodetector 60 and PID 112-1. The second control loop operates at a second frequency $f_2<f_1$ and is defined by thermal emission detector system 80, E/T logic 120, LPF 130 and PID 112-2. The two control loops L1 and L2 are coupled at PID 112-1.

There are several sources of noise in system 10 that must be controlled to maintain a constant (uniform) annealing temperature $T_A$. One noise source is the inherent noise in the output of laser 20, which has a characteristic 1/f distribution. Another source arises from systematic effects within system 10 itself. One example of this type of noise is the variation of the wafer temperature $T_W$ due to non-uniformities in heated chuck 50. Another example is variation in the power density of the annealing laser beam 24 due to out-of-plane motion of wafer 40 relative to the annealing laser beam 24, due to imperfections or setup tolerances in stage 52, which causes the power density in line image 24L to vary during the scan.

Another source of noise is emissivity "noise" stemming from the annealing laser beam 24 passing over regions within a given die 44 that have varying values of emissivity. This type of noise is uncompensated in the emission feedback system, since there is no real-time, localized measurement of emissivity available to correct the conversation of emission signal to temperature. This emissivity "noise" has a characteristic frequency that is determined by the physical spacing of the structures (e.g., metal lines or pads) within die 44, and the stage speed. This constitutes "noise" in the sense that it arises from a change of the measured signal resulting from an unmeasured (and thus uncompensated) physical attribute (emissivity) of the emitting surface.

In the absence of emissivity variations, a single control loop based on emission feedback from the local annealing line image 24L can manage the control of both laser 20 and systematic sources of error to maintain a substantially constant annealing temperature $T_A$. Such a system can maintain the required power density at wafer 40 regardless if the error being compensated for arises from the laser or from the system itself.

However, when the temperature measurement itself is erroneous because of localized changes in emissivity, such a loop will drive the system to an incorrect annealing temperature $T_A$ due to the change in emission signal level contributed by the change in emissivity.

System 10 thus employs dual-loop control using first and second control loops that cooperate to manage the main sources of noise, including eliminating or greatly reducing the above-described sensitivity to emissivity "noise."

The first control loop L1 operates to control the amount of power in annealing laser beam 24 by detecting laser annealing beam portion 24P with photodetector system 60 and providing the corresponding detector signal SD to input 113 of PID 112-1. PID 112-1 also receives the second control signal SC2 from the second control loop L2. The first loop control loop L1 operates at higher frequency $f_1$ than the frequency $f_2$ of the second loop L2. The first control loop L1 operates at a frequency $f_1$ sufficient to mitigate laser noise, which extends out to several hundred Hz (with a 1/f roll-off). In an example, frequency $f_1$ is in the range from about 1 KHz to about 100 KHz.

The second control loop L2 operates at a frequency $f_2<f_1$ and looks at the emission from wafer 40. The low-pass filtering of measured temperature signal $ST_M$ generates filtered temperature signal $ST_{MF}$. This signal is an average emission/temperature with a time average corresponding to a spatial average (that correspondence stemming from the scanning stage) that spans die-scale dimensions on wafer 40. The averaging reduces or eliminates the adverse effects of signal spikes due to emissivity variations. Thus, the temperature calculation is based on an average emissivity, where the "average" is taken over a relatively large distance (i.e., die scale). Logic in the E/T Logic 120 may also be used to facilitate suppression of emissivity-related variations in the emission signal SE, by numerical filtering, spike detection logic or other algorithms designed to mitigate the influence of emissivity-related variations in the emission signal SE on the filtered temperature signal $ST_{MF}$.

The second loop L2 then controls and corrects for low frequency (relative to first frequency h) error components, which mainly come from the aforementioned systematic errors. These systematic errors have a spatial period larger than die scale and so manifest themselves (in the time domain) at low frequency (as determined by the scan speed). The second control loop L2 updates the first loop's operational set point at PID controller 112-1. In an example, second frequency $f_2$ of second control loop L2 is in the range from 1 Hz to 100 Hz.

Compared to the laser 1/f noise, the signal content resulting from emissivity variations is typically more harmonic in spectral content because the surface structures creating the signal variations are themselves structured with more or less well-defined spatial periods. This results in a more or less well defined time-domain frequency response determined by the stage speed and physical spacing of the structures.

Thus, second control loop L2 measures the thermal emission E from wafer surface 42 at the location where line image 24L is being scanned. In an example, thermal emission detector system 80 has a field of view that is at least the size of die 44 in the Y-direction (i.e., the cross-scan direction) and that is at least as wide as line image 24L in the X-direction (i.e., the scan direction). In another example, the field of view need not cover the size of die 44 in the Y-direction, e.g., it can be several millimeters in the Y-direction while the die can have a Y-dimension of 1 cm or so. In an example, thermal emission detector system 80 includes a linear array of optical fibers (not shown).

The spatial averaging of the thermal emission measurement (and hence the annealing temperature measurement) is obtained by time-averaging during the scanning of annealing laser beam 24 over one or more dies 44. Thus, the measurement of the thermal emission E is used to measure the annealing temperature averaged over a select area, which is translated into a sample time based on the speed of line image 24L, which in an example is the speed of stage 52. In an example, thermal emission detector system 80 has a refresh rate of about 80 KHz that is then averaged by 4× to reduce the effective refresh rate to about 20 kHz.

In an example, the select area over which the emission/temperature is averaged is the size of a die 44 or larger so that the second control loop L2 responds to larger-than-die changes in temperature. Such temperature changes can arise, for example, from variations in the heating from heated chuck 50, variations in laser power density as might be caused by various mechanical drifts, laser efficiency/power drift, and the lower-frequency 1/f laser power variations. The second control loop L2 operates at substantially slower frequency $f_2$ than the first control loop frequency $f_1$, such $f_1>5\cdot f_2$, with an exemplary second frequency $f_2$ being about 10 Hz. In one example, $f_1 \approx (100)\cdot f_2$.

In an example, second control loop L2 is intended to provide feedback for relatively low-frequency changes in the emission/temperature resulting from more or less die-sized and up to wafer-diameter-size changes in substrate temperature and/or power density. If the second control loop frequency $f_2$ is set too close to the first control loop frequency $f_1$, the second control loop will try to adjust the amount of power in annealing laser beam 24 based on small changes in emission due to local changes in emissivity, e.g., the emissivity changes within a single die 44. It has been found that the annealing process is improved when such small-scale emissivity changes are ignored and the amount of power in annealing laser beam 24 is adjusted based on relatively large-area average emissivity (e.g., a die-size area, a multiple-die size area, etc.).

Thermal emission detector system 80 can include one or more detectors 81, including multiple detectors operating at multiple wavelengths for multi-color pyrometry. The one or more detectors preferably have sufficient detectivity (D*) to yield a reasonable signal-to-noise ratio (SNR) for the photon flux associated with thermal emission radiation 82 at the set-point annealing temperature $T_{AS}$ and for the given annealing laser beam geometry. An example thermal emission detector system 80 operates over a band-limited wavelength range for which the band-integrated thermal emission has good sensitivity to changes in temperature about the set-point annealing temperature $T_{AS}$.

For example, in the case of laser annealing junctions, the laser annealing temperature $T_A$ is in the range 1100° C. to 1250° C., and the appropriate wavelength range for thermal emission radiation is 500 nm to 900 nm. At these wavelengths, photo-multiplier tubes or Si-based photodiodes can be used as detectors. For contact annealing, the laser annealing temperatures $T_A$ are lower, e.g., in the range 800° C. to 1000° C., and a longer wavelength detector sensitive in the 1 μm to 2 μm region is appropriate, such as an InGaAs detector.

While the first and second control loops L1 and L2 are physically coupled and serve to adjust the laser power, the aforementioned difference in control loop frequencies $f_1$ and $f_2$ serve to functionally decouple the two control loops so that each can operate in independently and in a stable manner, so that one control loop does not introduce instabilities into the other.

The dual-loop control approach to laser annealing disclosed herein can be considered a hybrid approach based on wafer-to-wafer (WTW) and wafer-within-wafer (WIW) approaches. The second control loop L2 provides WIW-like feedback, but operates at a relatively "slow" frequency $f_2$ so that it is averaging emission over one or more dies 44, while the first control loop L1 is "fast" to compensate for corresponding 1/f noise in laser 20 that contributes to unwanted power fluctuations and thus unwanted annealing temperature variations.

It will be apparent to those skilled in the art that various modifications and variations can be made to the present disclosure without departing from the spirit and scope of the disclosure. Thus it is intended that the present disclosure cover the modifications and variations of this disclosure provided they come within the scope of the appended claims and their equivalents.

What is claimed is:

1. A method of annealing with a laser a wafer having a melt temperature and a surface that supports an array of dies with each die having a varying emissivity, comprising:
   scanning an annealing laser beam from the laser over the array of dies, wherein the laser has laser noise and is adjustable to control an amount of power in the annealing laser beam, wherein the annealing laser beam creates an annealing temperature at the wafer surface that does not exceed the wafer melt temperature;
   measuring and controlling the amount of power in the annealing laser beam using a first control loop that measures the amount of power and operates at a first frequency $f_1$ to control the laser noise in the laser; and
   controlling the amount of power in the annealing laser beam using a second control loop that operates at a second frequency $f_2 < f_1$ by measuring thermal emission radiation from the wafer, including averaging the thermal emission radiation over at least one die and determining therefrom a corresponding average measured temperature, and using the average measured temperature and an annealing temperature set point to adjust the laser to control the amount of power in the annealing laser beam.

2. The method of claim 1, wherein the first frequency $f_1$ is in a range from 1 kHz to 100 kHz and the second frequency $f_2$ is in the range from 1 Hz to 100 Hz.

3. The method of claim 1, wherein $f_1$ is about $(100) \cdot f_2$.

4. The method of claim 1, wherein measuring the amount of power in the laser annealing beam includes deflecting a portion of the laser annealing beam to a photodetector system.

5. The method of claim 4, wherein deflecting a portion of the laser annealing beam includes diffracting a portion of the laser annealing beam using a grating formed on a reflective surface from which the laser annealing beam otherwise reflects.

6. The method of claim 1, wherein the wafer has a Brewster's angle, and wherein the measuring thermal emission radiation from the wafer is performed at Brewster's angle.

7. The method of claim 1, wherein the wafer is either a logic wafer or a memory wafer.

8. The method of claim 1, wherein the first and second control loops respectively employ first and second proportional-integral-derivative controllers that are coupled to one another.

9. The method of claim 1, wherein the laser annealing beam creates an annealing temperature at the wafer surface in the range from 400° C. to 1350° C.

* * * * *